US005915181A

United States Patent [19]
Tseng

[11] Patent Number: 5,915,181
[45] Date of Patent: Jun. 22, 1999

[54] METHOD FOR FORMING A DEEP SUBMICRON MOSFET DEVICE USING A SILICIDATION PROCESS

[75] Inventor: Horng-Huei Tseng, Hsinchu, Taiwan

[73] Assignee: Vanguard International Semiconductor Corporation, Hsin-Chu, Taiwan

[21] Appl. No.: 08/684,805

[22] Filed: Jul. 22, 1996

[51] Int. Cl.$^6$ ...................... H01L 21/336; H01L 21/8234
[52] U.S. Cl. ........................ 438/289; 438/303; 438/664; 438/755; 438/291
[58] Field of Search .................................. 438/688, 217, 438/289, 450, 637, 664, 299, 301, 303, 305, 185, 755, 721, 270, 291, 647, 649, 655, 672, 675

[56] References Cited

U.S. PATENT DOCUMENTS

| | | | |
|---|---|---|---|
| 4,359,812 | 11/1982 | Abbas et al. | 438/251 |
| 4,803,173 | 2/1989 | Sill et al. | 438/301 |
| 4,818,723 | 4/1989 | Yen | 438/649 |
| 5,162,254 | 11/1992 | Usui et al. | 438/404 |
| 5,270,234 | 12/1993 | Huang et al. | 438/291 |
| 5,334,545 | 8/1994 | Caviglia | 438/655 |
| 5,360,766 | 11/1994 | Ko et al. | 438/528 |
| 5,422,289 | 6/1995 | Pierce | 438/297 |
| 5,447,874 | 9/1995 | Grivna et al. | 438/692 |
| 5,489,543 | 2/1996 | Hong | 438/291 |
| 5,677,217 | 10/1997 | Tseng | 438/217 |
| 5,776,822 | 7/1998 | Fujii et al. | 438/586 |
| 5,786,255 | 7/1998 | Yeh et al. | 438/299 |

*Primary Examiner*—Savitri Mulpuri
*Attorney, Agent, or Firm*—George O. Saile; Stephen B. Ackerman

[57] ABSTRACT

A process for fabricating a deep submicron MOSFET device has been developed, featuring a local threshold voltage adjust region in a semiconductor substrate, with the threshold voltage adjust region self aligned to an overlying polysilicon gate structure. The process consists of forming a narrow hole opening in a dielectric layer, followed by an ion implantation procedure used to place the threshold voltage adjust region in the specific area of the semiconductor substrate, underlying the narrow hole opening. A polysilicon deposition, followed by a metal deposition and anneal procedure, converts the unwanted polysilicon to a metal silicide layer, while leaving unconverted polysilicon in the narrow hole opening. Selective removal of the metal silicide layer results in a narrow polysilicon gate structure, in the narrow hole opening, self aligned to the threshold voltage adjust region.

22 Claims, 4 Drawing Sheets

METHOD FOR FORMING A DEEP SUBMICRON MOSFET DEVICE USING A SILICIDATION PROCESS

BACKGROUND OF THE INVENTION (1) Field of the Invention

The present invention relates to a process in which metal oxide semiconductor field effect transistor, (MOSFET), devices are fabricated, and more specifically to a process used to fabricate MOSFET devices with very narrow channel lengths.

(2) Description of Prior Art

The semiconductor industry is continually trying to decrease the cost of semiconductor chips, specifically chips comprised with MOSFET devices, while always striving to improve the performance of the semiconductor chip, or the performance of an individual MOSFET device. These objectives have been in part realized via the ability of the semiconductor industry to utilize submicron features, micro-miniaturization, in semiconductor chips. The ability to achieve micro-miniaturization has been realized via advances in specific semiconductor fabrication disciplines, mainly photolithograhy and anisotropic dry etching. For example the use of more sophisticated exposure cameras, as well as the development of more sensitive photoresist materials, has resulted in the routine attainment of submicron images in photoresist layers. In turn the development of reactive ion etching, (RIE), tools and processes, has allowed the submicron images in photoresist layers to be easily transferred to underlying materials used in the fabrication of semiconductor devices. However to continue to improve the performance of MOSFET devices, specifically areas of the MOSFET device have to be properly engineered to optimize performance.

MOSFET devices with channel lengths less then 0.35 uM, or deep submicron MOSFET devices, are now being fabricated, resulting in improved device performance. The smaller features of the deep submicron MOSFET device results in a decrease in parasitic capacitances, which in turn results in a performance increase, when compared to MOSFET counterparts, fabricated with larger dimensions. However there still remains specific areas of the deep submicron MOSFET device, in which additional, undesired parasitic capacitance adversely influence performance. For example the threshold voltage adjust region, created in the channel region of the MOSFET device, results in a significant level of junction capacitance. This invention will describe a fabrication method for creating deep submicron MOSFET devices, in which the unwanted junction capacitance, resulting from a threshold voltage adjust region, is reduced. This is accomplished by restricting the width of threshold voltage adjust region to a width identical to the width of a narrow polysilicon gate structure. The ability to self align the narrow polysilicon gate structure to a local threshold voltage adjust region, is accomplished via a unique processing procedure, featuring an ion implantation step, in a hole opened in a dielectric layer, to create the local threshold adjust region. A polysilicon refill process, used to fill the hole in the dielectric layer, and a silicidation procedure, used to remove the unwanted polysilicon, are then performed, resulting in the creation of the narrow polysilicon gate structure, self aligned to the local threshold voltage adjust region. Prior art such as Hong, et al., in U.S. Pat. No. 5,489,543, uses a threshold voltage adjust region formed via ion implantation through a polysilicon layer, and a gate insulator layer, into the underlying semiconductor substrate. This invention will describe a polysilicon gate structure formed after creation of a local threshold voltage region, self aligned to the local threshold voltage adjust region via use of an opening in a dielectric layer, used for both the threshold voltage adjust, and the polysilicon gate structure definition.

SUMMARY OF THE INVENTION

It is an object of this invention to fabricate a deep submicron MOSFET device using a local threshold voltage adjust region.

It is another object of this invention to create a local threshold voltage adjust region, in a semiconductor substrate, via an ion implantation of dopants through a gate insulator layer, and into a local region of a semiconductor substrate, using a narrow hole opening, in a dielectric layer, as a mask.

It is still another object of this invention to use a narrow polysilicon gate structure for the deep submicron MOSFET device, self aligned to a local threshold voltage adjust region.

It is still yet another object of this invention to create a narrow polysilicon gate structure by completely filling the narrow hole opening in a dielectric layer with polysilicon, followed by the deposition of a metal, an anneal to convert unwanted polysilicon to a metal silicide, and removal of the metal silicide, resulting in the creation of the narrow polysilicon gate structure, in the narrow hole opening in a dielectric layer, self aligned to a local threshold voltage adjust region.

In accordance with the present invention a process for fabricating deep submicron MOSFET devices, using a narrow polysilicon gate structure, self aligned to a local threshold voltage adjust region, is described. An insulator is deposited on a semiconductor substrate. Photolithographic and reactive ion etching, (RIE), procedures are used to create a narrow hole opening in the insulator layer, to a channel region on the semiconductor substrate. A gate insulator layer is thermally grown on the surface of the semiconductor substrate, exposed in the narrow hole opening in the insulator layer. An ion implantation procedure is performed, through the gate insulator layer in the narrow hole opening, creating a local threshold adjust region, in the channel region of the semiconductor substrate. A polysilicon deposition is performed, completely filling the narrow hole opening in the insulator layer. A metal deposition, followed by an anneal, used to convert unwanted polysilicon to metal silicide, is next performed. Removal of the metal silicide, via wet etching procedures, result in the creation of a narrow polysilicon gate structure, on a gate insulator layer, directly overlying, and self aligned, to a local threshold adjust region. Lightly doped source and drain regions are next formed, followed by the deposition of another insulator layer, and anisotropic RIE procedures, used to create an insulator spacer on the sides of the narrow polysilicon gate structure. Heavily doped source and drain regions are next formed followed by contact metallization procedures.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
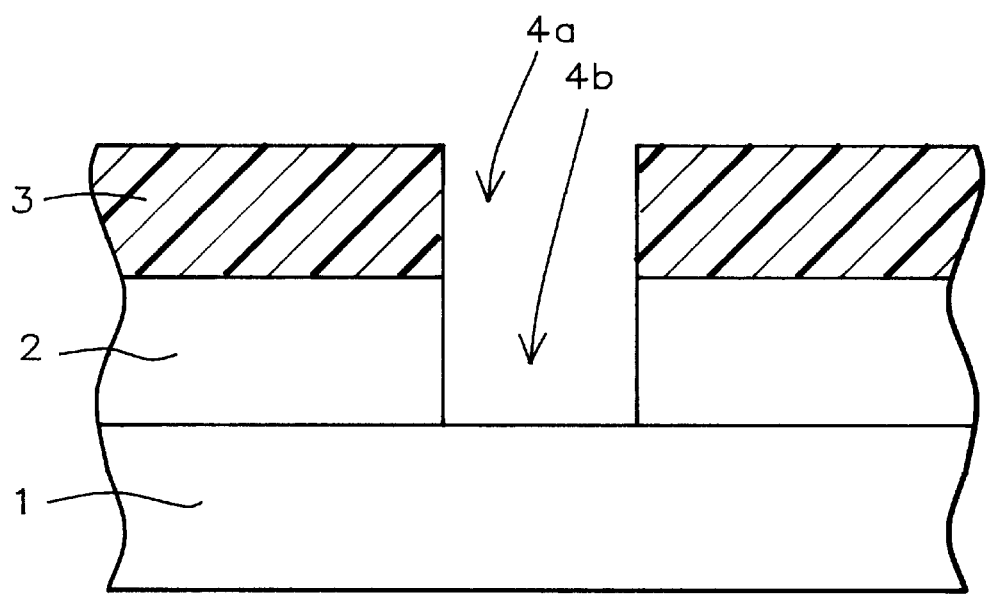
FIGS. 1–8, which schematically, in cross-sectional style, show the fabrication stages used to create a deep submicron MOSFET device, with a narrow polysilicon gate structure self aligned to an underlying local threshold voltage adjust region.

The method for creating a deep submicron MOSFET device will now be covered in detail. Deep submicron is referred to as a dimension of less than 0.35 uM in width, and a deep submicron MOSFET device is referred to a MOSFET device with a submicron channel length of less than 0.35 uM. A P type, single crystalline silicon substrate, 1, with a <100> crystallographic orientation, shown in FIG. 1, is used. Field oxide regions, (not shown in the drawings), comprised of between about 3000 to 6000 Angstroms of thermally grown silicon dioxide, are formed for purposes of isolation. A thick insulator layer of silicon oxide, 2, is next deposited using either low pressure chemical vapor deposition, (LPCVD), or plasma enhanced chemical vapor deposition, (PECVD), procedures, at a temperature between about 300 to 400° C., to a thickness between about 1500 to 4000 Angstroms. A photoresist layer, 3, with a narrow opening, or deep submicron opening, 4a, between about 0.2 to 0.5 uM, in width, is next formed on the surface of insulator layer, 2. A RIE procedure, using $CHF_3$ as an etchant, is next used to create a narrow hole opening, or a deep submicron hole opening, 4b, in insulator layer, 2, using the narrow opening 4a, in photoresist layer, 3, as a mask. This is shown schematically in FIG. 1. In this sequence the selectivity of the RIE procedure allows the etching procedure to terminate at the top surface of semiconductor substrate, 1, producing the narrow hole opening, 4b, with a width identical to the width of the narrow opening, 4a, in photoresist layer, 3, again between about 0.2 to 0.5 uM, in width.

Figure 2:
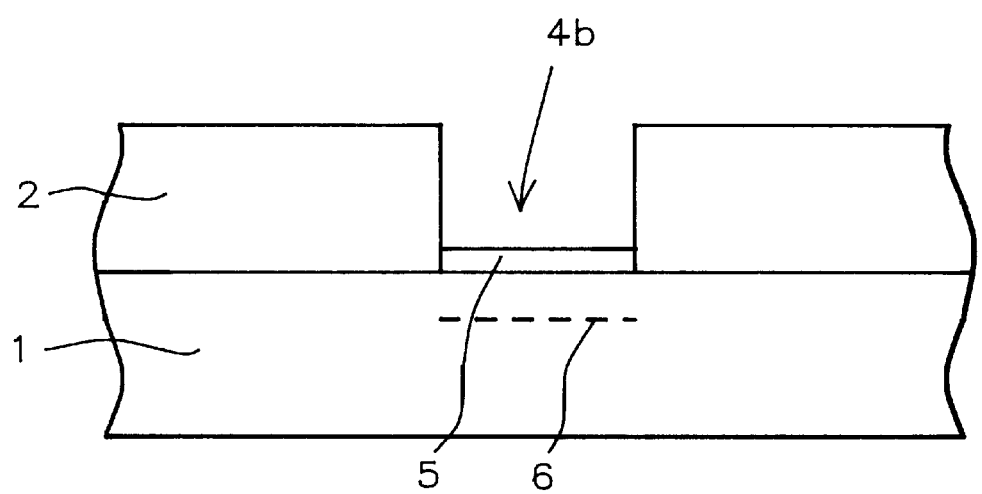

Photoresist layer, 3 is next removed via plasma oxygen ashing procedures and careful wet cleans. After a preclean using a dilute hydrofluoric solution, a silicon dioxide, gate insulator layer, 5, is thermally grown on the surface of semiconductor substrate, 1, exposed in narrow hole opening, 4b. Gate insulator layer, 5, shown schematically in FIG. 2, is obtained via thermal oxidation in an oxygen-steam ambient, at a temperature between about 800 to 950° C., to a thickness between about 50 to 200 Angstroms. A critical stage of this invention, the creation of a narrow, local threshold voltage adjust region, 6, is next addressed. An ion implantation of boron, at an energy between about 10 to 30 KeV, at a dose between about 1E11 to 1E13 atoms/cm$^2$, is used to place threshold voltage adjust region, 6, in semiconductor substrate, 1. This region is self aligned to the narrow hole opening, 4b, thus this narrow, local region of higher doping will subsequently allow less junction capacitance to result then counterparts fabricated with wider, threshold voltage adjust regions. The threshold voltage adjust region, 6, is schematically shown in FIG. 2.

Figure 3:
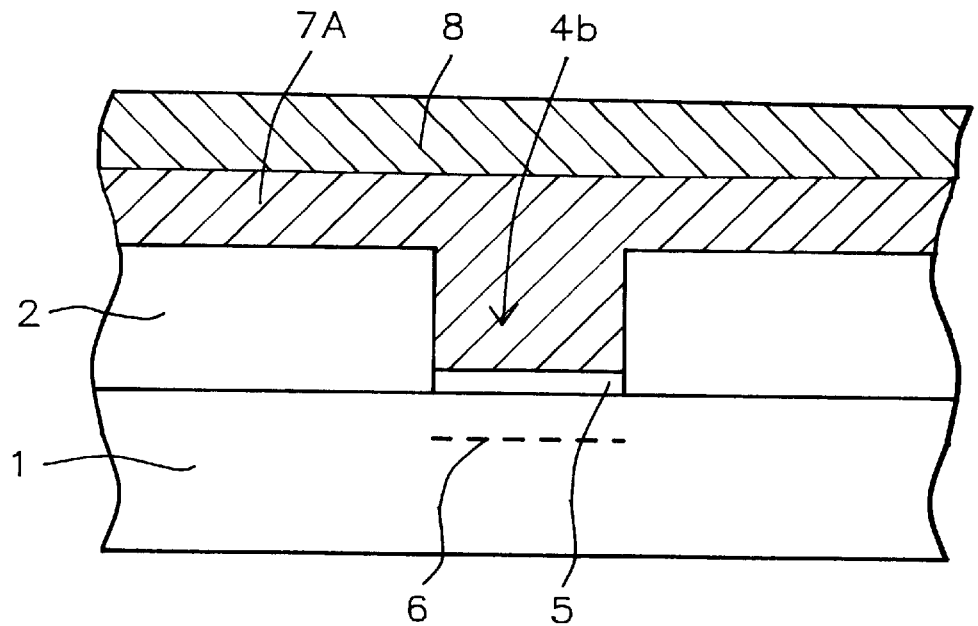

A polysilicon layer, 7a, shown schematically in FIG. 3, is next deposited using LPCVD procedures, at a temperature between about 525 to 575° C., to a thickness between about 1000 to 3000 Angstroms. Polysilicon layer, 7a, completely fills narrow hole opening, 4b. Polysilicon layer, 7a, can be deposited intrinsically and doped via ion implantation of phosphorous or arsenic, at an energy between about 25 to 75 KeV, at a dose between about 1E14 to 1E16 atoms/cm$^2$, or polysilicon layer, 7a, can be grown using insitu doping procedures via the incorporation of either phosphine or arsine to the silane ambient. A layer of titanium, 8, is next deposited on the top surface of polysilicon layer, 7a, to a thickness between about 500 to 1500 Angstroms, using r.f. sputtering procedures. FIG. 3, schematically shows the result of this deposition.

Figure 4:
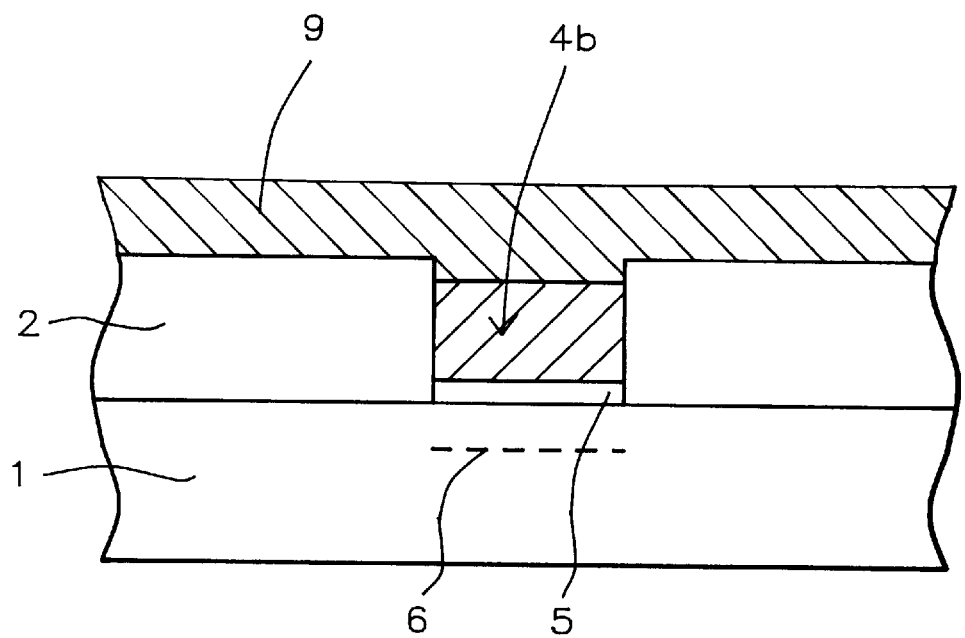
Figure 5:
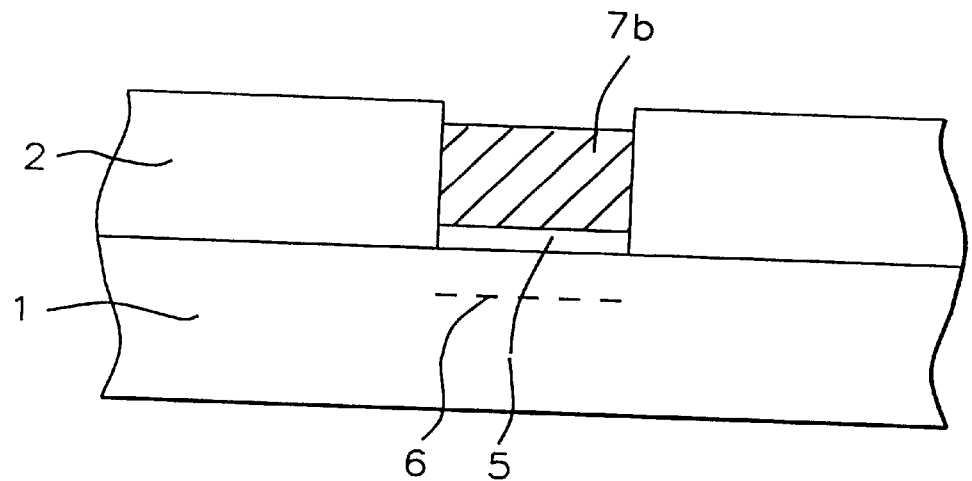

Removal of the unwanted polysilicon layer, 7a, designed, to result in a narrow polysilicon gate structure, 7b, self aligned to the narrow threshold voltage adjust region, 6, is next addressed, and schematically described in FIGS. 4–5. A rapid thermal anneal, (RTA), procedure, is used to completely consume polysilicon layer, 7a, overlying insulator layer, 2, and to convert polysilicon layer, 7b, overlying insulator layer, 2, to titanium silicide layer, 9, at a thickness between about 1500 to 3000 Angstroms. The anneal cycle also converts a top portion of polysilicon layer, 7a, over the narrow hole opening, 4b, to titanium silicide layer, 9. To account for possible polysilicon uniformity difficulties, the RTA procedure includes an extended anneal cycle, used to guarantee complete conversion of polysilicon layer, 7a, in areas in which polysilicon layer, 7a, overlaid insulator layer, 2. The consequence of the extended anneal cycle is the final polysilicon gate structure, 7b, in narrow hole opening, 4b, results in a thickness between about 1000 to 2500 Angstroms. Titanium silicide layer, 9, is then removed either via use of a buffered hydrofluoric acid solution, or via dry etching procedures. The resulting polysilicon gate structure, 7b, at a thickness between about 1000 to 2500 Angstroms, is schematically shown in FIG. 5.

Figure 6:
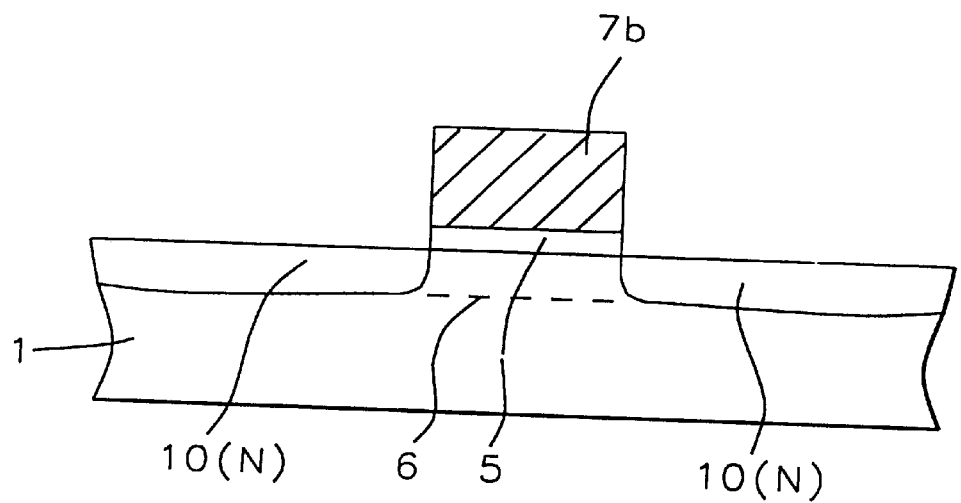
Figure 7:
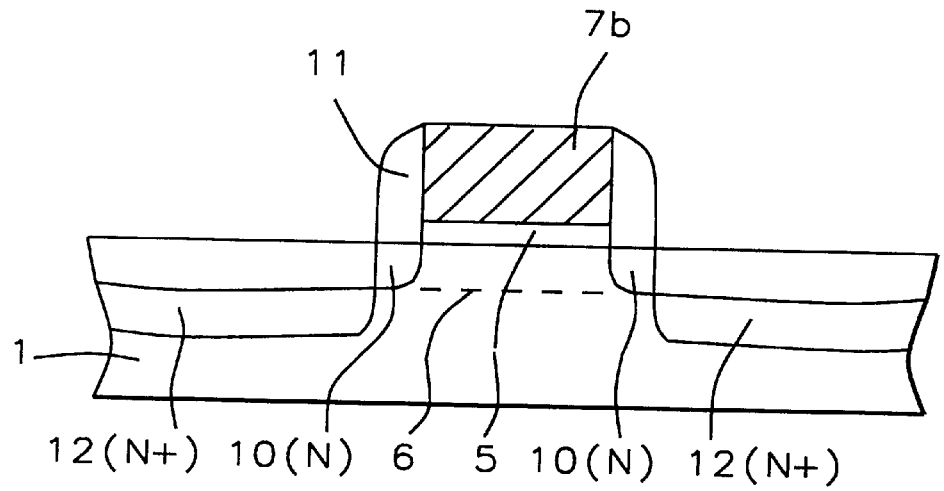

Insulator layer, 2, is next removed via selective, RIE procedures, using $CHF_3$ as an etchant, or via use of a buffered hydrofluoric acid solution. Polysilicon gate structure, 7b, now allows a lightly doped source and drain region, 10, to be created, via an ion implantation of phosphorous, at an energy between about 20 to 40 KeV, at a dose between about 1E13 to 1E14 atoms/cm$^2$. This is schematically shown in FIG. 6. Another insulator layer of silicon oxide, is next deposited using LPCVD or PECVD procedures, at a temperature between about 700 to 750° C., to a thickness between about 1000 to 3000 Angstroms, using tetraethylorthosilicate, (TEOS), as a source. An anisotropic, RIE procedure, using $CHF_3$ as an etchant, is used to create insulator spacer, 11, schematically shown in FIG. 7. Also shown in FIG. 7, is the creation of a heavily doped source and drain region, 12, formed via ion implantation of arsenic at an energy between about 30 to 100 KeV, at a dose between about 1E15 to 3E16 atoms/cm$^2$.

Figure 8:
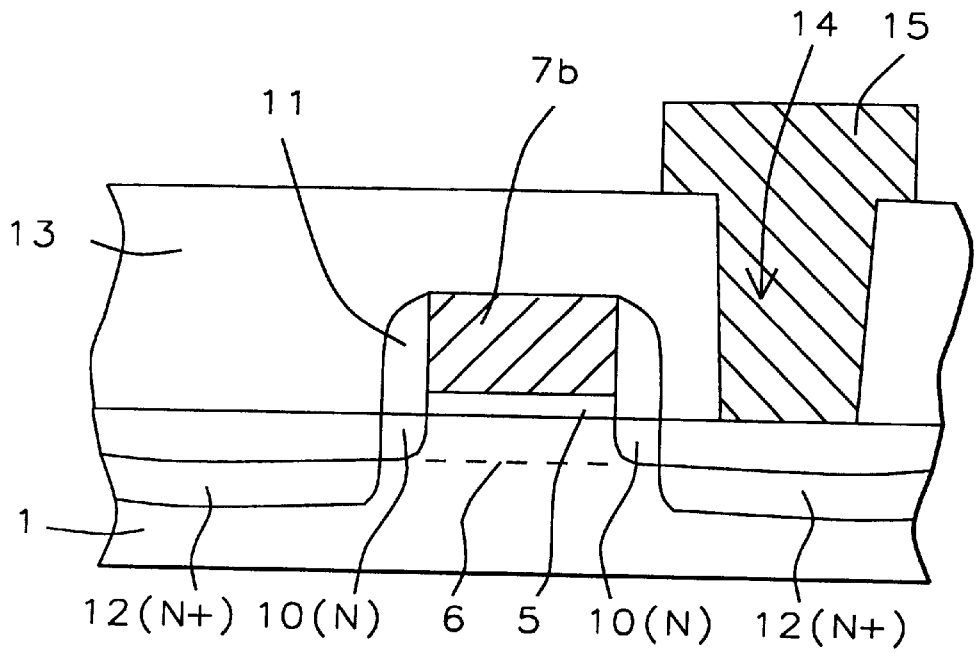

FIG. 8, schematically describes the processes used to create the metal contacts to the deep submicron MOSFET device. A silicon oxide layer, 13, is deposited using PECVD procedures, at a temperature between about 300 to 400° C., to a thickness between about 3000 to 8000 Angstroms. Conventional photolithographic and RIE procedures, using $CHF_3$ as an etchant, are used to create contact hole, 14, to heavily doped source and drain region, 12. An opening to polysilicon gate structure, 7b, is also created in silicon oxide layer, 13, however not shown in FIG. 8. The photoresist pattern, (not shown in FIG. 8), is then removed using plasma oxygen ashing and careful wet cleans. A metallization layer comprised of aluminum, containing between about 1 to 3% copper, and between about 0.5 to 2% silicon, is deposited using r.f. sputtering procedures, to a thickness between about 3000 to 8000 Angstroms. Conventional photolithographic and RIE procedures, using $Cl_2$ as etchant, are used to create metal contact structure, 15, shown schematically in FIG. 8. Photoresist removal is once again accomplished using plasma oxygen ashing and careful wet cleans.

This process for creating a deep submicron MOSFET device, using a local threshold voltage adjust region, although shown for the creation of an N channel, of NFET device can easily be used to create a P channel, or PFET device. This process can also be used to fabricate complimentary, (CMOS), or bipolar, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with a polysilicon gate structure self aligned to a local threshold voltage adjust region, comprising the steps of:

depositing a first insulator layer on said semiconductor substrate;

forming a photoresist pattern on said first insulator layer, with a first opening in said photoresist pattern, exposing top surface of said first insulator layer, with said first opening comprised with a width between about 0.20 to 0.50 um;

forming a second opening, in said first insulator layer, by removing said first insulator layer from said first opening in said photoresist pattern, with said second having a width between about 0.20 to 0.50 um;

thermal oxidation to grow a second insulator layer, to be used as a gate insulator layer, on the surface of said semiconductor substrate, exposed in said second opening;

ion implanting a first conductivity imparting dopant, through said second insulator layer, and into an area of said semiconductor substrate, defined by said second opening, to create said local threshold adjust region;

depositing a polysilicon layer, completely filling said second opening, and on top surface of said first insulator layer;

depositing a first metal layer on said polysilicon layer;

annealing to convert all of said polysilicon layer on top surface of said first insulator layer, and to convert a top portion of said polysilicon layer, in said second opening, to a metal silicide layer, while leaving a lower portion of said polysilicon, in said second opening, unreacted;

removal of said metal silicide layer, from top surface of said first insulator layer, and removal of said metal silicide layer from top surface of said lower portion of said polysilicon layer, in said opening, resulting in the formation of said polysilicon gate structure, in said second opening, self aligned to underlying, said local threshold voltage adjust region;

removal of said first insulator layer;

ion implanting a second conductivity imparting dopant into an area of said semiconductor substrate, not covered by said polysilicon gate structure, to from a lightly doped source and drain region;

depositing a third insulator layer on said semiconductor substrate, and on said polysilicon gate structure;

anisotropic etching of said third insulator layer, to form an insulator spacer on the sides of said polysilicon gate structure;

ion implanting a third conductivity imparting dopant into an area of said semiconductor substrate, not covered by said polysilicon gate structure, and not covered by said insulator spacer, to form a heavily doped source and drain region;

depositing a fourth insulator layer on said semiconductor substrate, and on said polysilicon gate structure;

opening a contact hole in said fourth insulator layer, to expose top surface of said heavily doped source and drain region;

depositing a second metal layer on top surface of said fourth insulator layer, on top surface of said heavily doped source and drain region; and patterning of said second metal layer, to form a metal contact structure to said heavily doped source and drain region.

2. The method of claim 1, wherein said first insulator layer is silicon oxide, deposited using PECVD procedures, at a temperature between about 300 to 400° C., to a thickness between about 1500 to 4000 Angstroms.

3. The method of claim 1, wherein said second opening in said insulator layer, is formed via anisotropic RIE procedures, using $CHF_3$ as an etchant.

4. The method of claim 1, wherein said second insulator layer, used as said gate insulator layer, is silicon dioxide, thermally grown in an oxygen-steam ambient, at a temperature between about 800 to 950° C., to a thickness between about 50 to 200 Angstroms.

5. The method of claim 1, wherein said first conductivity imparting dopant, used to create said local threshold adjust region, in an area of said semiconductor substrate defined by said second opening in said first insulator layer, is boron, ion implanted at an energy between about 10 to 30 KeV, at a dose between about 1E11 to 1E13 atoms/cm$^2$.

6. The method of claim 1, wherein said polysilicon layer, used to completely fill said second opening in said first insulator layer, is deposited using LPCVD procedures, at a temperature between about 525 to 575° C., to a thickness between about 1000 to 3000 Angstroms.

7. The method of claim 1, wherein said first metal layer is titanium, deposited via r.f. sputtering procedures, to a thickness between about 500 to 1500 Angstroms.

8. The method of claim 1, wherein said metal silicide layer, is titanium silicide, formed via a rapid thermal anneal procedure, at a temperature and time needed to completely convert all of said polysilicon layer, on top surface of said first insulator layer, to said metal silicide layer, at a thickness between about 1500 to 3000 Angstroms.

9. The method of claim 1, wherein rapid thermal anneal procedure results in the formation of said metal silicide, between about 1500 to 3000 Angstroms, formed from said top portion of said polysilicon layer, in said second opening, while leaving between about 1000 to 2500 Angstroms of said lower portion of said polysilicon silicon layer, in said second opening, unreacted, resulting in said polysilicon gate structure, remaining in said second opening.

10. The method of claim 1, wherein said metal silicide layer is removed via use of either a solution of buffered hydrofluoric acid, or via use of dry etching procedures.

11. The method of claim 1, wherein said first insulator layer is removed via use of either RIE procedures, using $CHF_3$ as an etchant, or via wet etching procedures, using a buffered hydrofluoric acid solution.

12. A method of fabricating a MOSFET device, on a semiconductor substrate, with a polysilicon gate structure, between about 0.20 to 0.50 urn. in width. self aligned to a local threshold voltage adjust region, comprising the steps of:

depositing a first insulator layer on said semiconductor substrate;

forming a photoresist pattern on said first insulator layer, with a first opening between about 0.20 to 0.50 urn. in width, in said photoresist pattern, exposing top surface of said first insulator layer;

forming a second opening, in said first insulator layer, by removing said first insulator layer, from an area defined by said first opening in said photoresist pattern with said second opening having a width between about 0.20 to 0.50 um:

thermal oxidation to grow a second insulator layer, to be used as a gate insulator layer, on the surface of said semiconductor substrate, exposed in said second opening;

ion implanting a first conductivity imparting dopant through said second insulator layer, and into an area of said semiconductor substrate, defined by said second opening, to create said local threshold voltage adjust region;

depositing a polysilicon layer, completely filling said second opening, and on top surface of said first insulator layer;

depositing a titanium layer on said polysilicon layer;

annealing to convert all of said polysilicon layer on top surface of said first insulator layer, and to convert a top portion of said polysilicon layer, in said second opening, to a titanium silicide layer, while leaving a lower portion of said polysilicon layer, in said second opening, unreacted;

removal of said titanium silicide layer from the top surface of said first insulator layer, and removal of said titanium silicide layer the top surface of said lower portion of said polysilicon layer, in said second opening, resulting in formation of said polysilicon gate structure, in said second opening, self aligned to underlying, said local threshold voltage adjust region;

removal of said first insulator layer;

ion implanting a second conductivity imparting dopant into an area of said semiconductor substrate, not covered by said polysilicon gate structure, to form a lightly doped source and drain region;

depositing a third insulator layer on said semiconductor substrate, and on said polysilicon gate structure;

anisotropic etching of said third insulator layer to form an insulator spacer on the sides of said polysilicon gate structure;

ion implanting a third conductivity imparting dopant into an area of said semiconductor substrate, not covered by said polysilicon gate structure, and not covered by said insulator spacer, to form a heavily doped source and drain region;

depositing a fourth insulator layer on said semiconductor substrate, and on said polysilicon gate structure;

opening a contact hole in said fourth insulator layer, to expose top surface of said heavily doped source and drain region;

depositing a metal layer on the top surface of said fourth insulator layer, on the top surface of said heavily doped source and drain region exposed in said contact hole; and patterning of said metal layer to form metal contact structure to said heavily doped source and drain region.

13. The method of claim 12, wherein said first insulator layer is silicon oxide, deposited using PECVD procedures, at a temperature between about 300 to 400° C., to a thickness between about 1500 to 4000 Angstroms.

14. The method of claim 12, wherein said second opening, in said first insulator layer, is formed via anisotropic RIE procedures, using $CHF_3$ as an etchant.

15. The method of claim 12, wherein said second insulator layer, used as said gate insulator layer, is silicon dioxide, thermally grown in an oxygen-steam ambient, at a temperature between about 800 to 950° C., to a thickness between about 50 to 200 Angstroms.

16. The method of claim 12, wherein said first conductivity imparting dopant, used to create local threshold voltage adjust region, in an area of said semiconductor substrate defined by said second hole opening, is boron, ion implanted at an energy between about 10 to 30 KeV, at a dose between about 1E11 to 1E13 atoms/cm$^2$.

17. The method of claim 12, wherein said polysilicon layer, used to completely fill said second hole opening, in said first insulator layer, is deposited using LPCVD procedures, at a temperature between about 525 to 575° C., to a thickness between about 1000 to 3000 Angstroms.

18. The method of claim 12, wherein said titanium layer is deposited using r.f. sputtering procedures, to a thickness between about 500 to 1000 Angstroms.

19. The method of claim 12, wherein said titanium silicide layer is formed using a rapid thermal anneal procedure at a temperature and time needed to completely convert all of said polysilicon layer, on top surface of said first insulator layer, to said titanium silicide layer, at a thickness between about 1500 to 3000 Angstroms.

20. The method of claim 12, wherein a rapid thermal anneal procedure is used at a temperature and time needed to create between about 1500 to 3000 Angstroms of said titanium silicide, formed from said top portion of said polysilicon layer, in said second hole opening, while leaving between about 1000 to 2500 Angstroms of said lower portion of said polysilicon layer, in said second hole opening, unreacted, resulting in said polysilicon gate structure, in said second hole opening.

21. The method of claim 12, wherein said titanium silicide layer is removed either via dry etching procedures, or via use of a solution of buffered hydrofluoric acid.

22. The method of claim 12, wherein said first insulator layer is removed either via RIE procedures, using $CHF_3$ as an etchant, or via use of a buffered hydrofluoric acid solution.

* * * * *